(12) United States Patent
Kugler et al.

(10) Patent No.: US 7,851,344 B2
(45) Date of Patent: Dec. 14, 2010

(54) METHOD OF PRODUCING A SUBSTRATE HAVING AREAS OF DIFFERENT HYDROPHILICITY AND/OR OLEOPHILICITY ON THE SAME SURFACE

(75) Inventors: Thomas Kugler, Cambridge (GB); Shunpu Li, Cambridge (GB); Christopher Newsome, Cambridge (GB); David Russell, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 577 days.

(21) Appl. No.: 11/520,668

(22) Filed: Sep. 14, 2006

(65) Prior Publication Data

US 2007/0066078 A1   Mar. 22, 2007

Related U.S. Application Data

(63) Continuation of application No. 11/517,444, filed on Sep. 8, 2006, now abandoned.

(30) Foreign Application Priority Data

Sep. 20, 2005   (GB) ................... 0519185.1

(51) Int. Cl.
*H01L 21/44* (2006.01)
(52) U.S. Cl. ................. 438/599; 257/E21.575
(58) Field of Classification Search ............. 438/99, 438/151, 745, 725, 758, 780; 257/40; 136/244
See application file for complete search history.

(56) References Cited

U.S. PATENT DOCUMENTS

| 4,204,865 | A |   | 5/1980 | Kuehnle et al. |         |
|-----------|---|---|--------|----------------|---------|
| 4,380,196 | A | * | 4/1983 | Kato et al.    | 101/453 |
| 5,419,781 | A | * | 5/1995 | Hamakawa et al.| 136/244 |
| 6,352,758 | B1| * | 3/2002 | Huang et al.   | 428/143 |
| 2001/0033135 | A1 | * | 10/2001 | Duggal et al. | 313/506 |
| 2003/0059975 | A1 | * | 3/2003  | Sirringhaus et al. | 438/99 |

(Continued)

FOREIGN PATENT DOCUMENTS

EP   0 690 349 A1   1/1996

(Continued)

OTHER PUBLICATIONS

C. Drummon et al., "Van der Waals Interaction, Surface Free Energies, and Contact Angles: Dispersive Polymers and Liquids," *Langmuir* 1997, 13, 3890-3895.

(Continued)

*Primary Examiner*—David A Zarneke
(74) *Attorney, Agent, or Firm*—Oliff & Berridge, PLC (57) ABSTRACT

The present invention relates to flexible substrates having on their surface a wetting contrast. The wetting contrast comprises adjacent areas of different hydrophilicity and/or oleophilicity. The present invention further relates to methods of production of such substrates and to methods of producing microelectronic components wherein electronically functional material is deposited onto said substrates.

According to a first aspect of the present invention, a method of producing a flexible substrate having a wetting contrast is provided. The method includes the step of forming a first area comprising an inorganic material on a flexible substrate precursor to form a substrate wherein the inorganic material is at least partially exposed at the substrate surface and the first area constitutes a pattern on the precursor surface.

17 Claims, 6 Drawing Sheets

U.S. PATENT DOCUMENTS

| | | | |
|---|---|---|---|
| 2003/0161959 A1* | 8/2003 | Kodas et al. | 427/376.2 |
| 2004/0002225 A1 | 1/2004 | Wong et al. | |
| 2004/0234816 A1 | 11/2004 | Azakami et al. | |
| 2004/0238816 A1* | 12/2004 | Tano et al. | 257/40 |
| 2005/0147766 A1 | 7/2005 | Aoki | |
| 2005/0247928 A1* | 11/2005 | Unno | 257/40 |
| 2007/0063640 A1* | 3/2007 | Duineveld et al. | 313/506 |
| 2007/0254107 A1* | 11/2007 | Rao et al. | 427/372.2 |
| 2007/0259182 A1* | 11/2007 | Bujard et al. | 428/405 |

FOREIGN PATENT DOCUMENTS

| | | |
|---|---|---|
| EP | 0 903 389 A1 | 3/1999 |
| EP | 1 580 595 A2 | 9/2005 |
| GB | 2 391 385 A | 2/2004 |
| JP | A 56-105960 | 8/1981 |
| JP | A 59-176329 | 10/1984 |
| JP | A 11-5926 | 1/1999 |
| JP | A 2000-190649 | 7/2000 |
| JP | A-2004-98351 | 4/2004 |
| WO | WO 99/57185 | 11/1999 |
| WO | WO 01/47045 A1 | 6/2001 |
| WO | WO 02/073712 A1 | 9/2002 |
| WO | WO 03/046062 A1 | 6/2003 |
| WO | WO 2004/052647 A2 | 6/2004 |
| WO | WO 2005/014184 A1 | 2/2005 |
| WO | WO 2005/075112 A1 | 8/2005 |

OTHER PUBLICATIONS

G. Alberti et al., "Wetting of Rough Surfaces: A Homogenization Approach," *Proc. Roy. Soc. London A.*, pp. 1-18, Jun. 21, 2004.

A. Synytska et al., "Tuning Wettability by Controlled Roughness and Surface Modification Using Core-Shell Particles," *Polymeric Materials: Science and Engineering.* 90, pp. 624-625, 624, 2004.

C. Lorenz-Haas et al., "Nucleated Dewetting of Thin Polymer Films," *Applied Physics A*, 74 [Supp.], 383-5, 2002.

P. Muller-Buschbaum, "Dewetting and Pattern Formation in Thin Polymer Films as Investigated in Real and Reciprocal Space," *J. Phys.: Condensed Matte*, 15, Abstract, 2003.

B. Muller, "Impact of Nanometer-Scale Roughness on Contact-Angle Hysteresis and Globulin Absorption," *J. Vac. Sci. Technol. B*, 19(5), pp. 1715-1720, Sep./Oct. 2001.

* cited by examiner

METHOD OF PRODUCING A SUBSTRATE HAVING AREAS OF DIFFERENT HYDROPHILICITY AND/OR OLEOPHILICITY ON THE SAME SURFACE

This is a Continuation of application Ser. No. 11/517,444, filed Sep. 8, 2006 now abandoned, which in turn is a non-provisional, which claims the benefit of Great Britain Patent Application No. 0519185.1, filed Sep. 20, 2005. The disclosure of the prior application is hereby incorporated by reference herein it its entirety.

FIELD OF INVENTION

The present invention relates to a method of producing a flexible substrate having areas of different hydrophilicity and/or oleophilicity on the same surface. Such substrates have a use for example in the field of solution processing to form microelectronic devices.

TECHNICAL BACKGROUND

Electronically functional materials such as conductors, semiconductors and insulators have many applications in modern technology. In particular, these materials are useful in the production of microelectronic components such as transistors (e.g. thin film transistors (TFTs)) and diodes (e.g. light emitting diodes (LEDs)). Inorganic materials such as elemental copper, elemental silicon, and silicon dioxide have traditionally been employed in the production of these microelectronic components, whereby they are deposited using physical vapour deposition (PVD) or chemical vapour deposition (CVD) methods. Recently, newly developed materials and material formulations with conducting, semiconducting or insulating properties have become available and are being adopted in the microelectronic industry.

One such class of electronically functional materials is that of organic semiconductor materials. Another class is that of inorganic metal colloid formulations dispersed in liquid solvents. While the first example is a recently developed class of materials, the second example uses traditional materials in a recently developed formulation type. These materials and material formulations are associated with a number of advantages over the traditional materials when used for microelectronic device production. One such advantage is that these materials can be processed in a greater variety of ways, including solution processing where the material is dissolved in a solvent or dispersed as a colloid, and the resulting solution is used to manufacture e.g. microelectronic components. This is advantageous because solution processing is very cost-effective. In particular, a significant saving can be made in terms of start-up costs associated with setting up plants for producing microelectronic components when compared with e.g. silicon semiconductor processing facilities where there is a need for high capital investment in expensive production facilities.

One particularly promising technique for the processing of semiconductors to form microelectronic components, for example TFTs and LEDs, is ink-jet printing. This is because ink-jet printing conveniently allows relatively precise deposition of a semiconductor solution onto a substrate in an automated manner. It would be highly desirable to be able to produce microelectronic semiconductor components on an industrial scale by ink-jet printing conductor, semiconductor and insulator solutions onto a suitable substrate.

However, there are fundamental problems in carrying this out in practice. The key problem is that, in the production of microelectronic devices, it is generally necessary to produce high-resolution patterns of the electronically functional materials on a substrate. At present, ink-jet printing does not allow a high enough resolution to be achieved to allow the direct printing of suitable patterns onto a bare substrate. At present, there are two ways to avoid this problem.

The first way is to use photolithography to remove undesired areas of a blanket-deposited electronically functional material, very high-resolution patterns being obtainable by this method. However, photolithography is a subtractive technology and is expensive both in terms of initial investment in expensive photolithographic equipment and in terms of the relatively large number of processing steps associated with these techniques, energy consumption and wasted material.

A second way of circumventing the resolution problems associated with ink-jet printing of patterns of electronically functional materials on bare substrates is to form a pre-pattern on the substrate prior to deposition of the electronically functional material thereon which directs the ink-jet-printed solution onto specific areas. Generally, this involves treating the substrate to form a wetting contrast consisting of adjacent areas on the surface having different hydrophilicity and/or oleophilicity to ensure different interaction with electronically functional inks subsequently printed thereon. Thus a substrate can be produced having ink-receptive areas and ink-repellent areas, so that a droplet of ink landing on an ink-receptive area of the substrate would be prevented from spreading onto the adjacent ink repellent area. Similarly, any droplet of ink landing so that it contacts both the ink-receptive and ink-repellent areas would be pushed towards the ink-receptive areas. In this way, the resolution of an ink-jet printer can be enhanced to allow the required resolution to produce patterning as required in the production of microelectronic devices. For this to work effectively, the difference in hydrophilicity and/or oleophilicity between the two areas of the substrate should be as large as possible.

At present, this latter technique requiring the establishment of adjacent ink-receptive areas and ink-repellent areas on a substrate has only been realised on inorganic substrates such as indium tin oxide or silicon oxide (glass) plates. Where such a substrate is used, it is conventional to apply a photo-crosslinkable polymer (=negative resist) coating (for example polyimide) to an inorganic oxide plate and then selectively dissolve those parts of the polymer coating that were protected by a photomask against the UV-irradiation during a crosslinking step to reveal the underlying inorganic oxide. Subsequent treatment of the entire substrate with e.g. a $CF_4$ plasma leaves the exposed inorganic oxide substrate hydrophilic but renders the polymer surface hydrophobic and oleophobic thus establishing a wetting contrast. Subsequent printing of an aqueous conductor ink onto the exposed glass parts allow a high resolution pattern to be formed even if the patterning carried out is required to be of higher resolution than the ink-jet printing because droplets of aqueous ink falling in part on the hydrophobic and oleophobic polymer area will be pushed on to the hydrophilic glass area.

Whilst this method of creating adjacent ink-receptive and ink-repellent areas on the substrate is generally quite effective in increasing the resolution obtainable when ink-jet printing a solution of an electronically functional material, significant problems are associated with these techniques when carrying them out on a commercial scale.

In order to reduce production costs, it is desirable to print microelectronic devices using a so-called reel-to-reel (R2R) production environment. Here, a substrate is rolled off a first reel, processed, and then rolled onto a second reel. A precondition for using such a production method is that the substrate must be flexible. At present, the flexible substrates of interest are most often polymer foils. However, none of the flexible substrates which are currently available are suitable for making substrates with appropriate wetting contrasts in a commercially viable manner.

It is possible to produce a wetting contrast on a polymer substrate, for example by exposing one part of the substrate to $O_2$ plasma to render it hydrophilic and to expose another part to $CF_4$ plasma to render it hydrophobic and oleophobic. However, $CF_4$ treatment affects both pristine polymer surfaces as well as surfaces which have been exposed to $O_2$ plasma, so that surface patterns which are to remain hydrophilic after $CF_4$ treatment must be protected by a photoresist mask during the $CF_4$ plasma treatment. This is not desirable, in part because this requires two extra processing steps (the application and removal of the mask) which adds to the production cost, but mainly because the hydrophilicity of the hydrophilic area is decreased on removal of the mask due to residual photoresist material which cannot be removed. An inversion of the order of the processing steps might in theory alleviate the latter of these problems, but cannot be realised as photoresist material does not adhere to a fluorinated surface. Therefore, it is not possible to produce flexible substrates with a wetting contrast where the adjacent areas making up the contrast area differ enough in hydrophilicity and/or oleophilicity for these to be used to good effect in ink-jet printing solutions of electronically functional materials onto these to produce microelectronic components.

Accordingly, there is still a need for the realisation of wetting contrasts on flexible polymer foils to allow an increase in the resolution of ink-jet printing electronically functional inks onto such substrates to produce microelectronic devices such as TFTs and LEDs.

The present inventors set out to provide a commercially useful method of producing a substrate having an appropriate wetting contrast wherein the substrate is not limited to being a rigid substrate formed from an inorganic oxide such as glass or indium tin oxide, and wherein the above-mentioned problems can be avoided.

BRIEF DESCRIPTION OF THE PRESENT INVENTION

According to a first aspect of the present invention, there is provided a method of producing a flexible substrate having a surface which comprises adjacent areas of different hydrophilicity and/or oleophilicity, the method comprising the step of:

(ia) forming a first area comprising an inorganic material on a flexible substrate precursor to form a substrate wherein the inorganic material is at least partially exposed at the substrate surface and the first area constitutes a pattern on the precursor.

According to second aspect of the present invention, there is provided a method of producing a flexible substrate having a surface which comprises adjacent areas of different hydrophilicity and/or oleophilicity, the method comprising the steps of:

(ib) forming a first area comprising an inorganic material on a flexible substrate precursor by depositing a first composition thereon wherein the inorganic material is at least partially exposed at the surface; and (ic) forming on the first area a pattern of a second composition comprising a polymer to form a second area having a different hydrophilicity and/or oleophilicity to the first area.

According to a third aspect of the present invention, there is provided a method of producing a flexible substrate having a surface which comprises adjacent areas of different hydrophilicity and/or oleophilicity, the method comprising the steps of:

(id) providing a flexible substrate precursor comprising an inorganic material which is at least partially exposed at the surface; and (ie) forming on the precursor a pattern of a composition having a different hydrophilicity and/or oleophilicity to the precursor.

According to a fourth aspect of the present invention, there is provided a method of producing a flexible substrate having a surface which comprises adjacent areas of different hydrophilicity and/or oleophilicity, the method comprising the steps of:

(if) forming a layer comprising an inorganic material on a flexible substrate precursor so that substantially no inorganic material is present at the surface; and (ig) patternwise treating the precursor comprising the layer to reveal inorganic material at the surface where the precursor has been treated.

According to a fifth aspect of the present invention, there is provided a method of producing a modified substrate (A) having a surface which comprises adjacent areas of different hydrophilicity and/or oleophilicity, the method comprising the steps of:

(i) producing a substrate by any method defined above, wherein the substrate surface comprises an area where the inorganic material is present and an area where a polymer is present; and (ii) chemically treating the substrate surface to form the modified substrate (A) wherein the adjacent surface areas of the modified substrate (A) have a greater difference in hydrophilicity and/or oleophilicity than the corresponding areas of the substrate prior to chemical treatment.

According to a sixth aspect of the present invention, there is provided a method of producing a modified substrate (B) having a surface which comprises a first area which is hydrophobic and oleophilic and an adjacent second area which is hydrophobic and oleophobic, the method comprising the steps of:

(i) producing a substrate or a modified substrate (A) by any method defined above; wherein the adjacent areas are respectively hydrophobic and hydrophilic; and (ii) treating the substrate or modified substrate (A) with a fluoroalkylsilane.

According to a seventh aspect of the present invention, there is provided a method of producing a microelectronic component, comprising the steps of:

(i) producing a substrate or modified substrate (A) or (B) having adjacent areas of different hydrophilicity and/or oleophilicity on the same surface by any method defined above; and (ii) depositing a first solution onto the substrate or modified substrate (A) or (B) to form an area comprising a first electronically functional material.

According to an eighth aspect of the present invention, there is provided a flexible substrate having adjacent areas of different hydrophilicity and/or oleophilicity on the same surface, the substrate comprising an inorganic material on at least part of one or more of its surfaces.

DETAILED DESCRIPTION OF THE PRESENT INVENTION

The present inventors have investigated possible ways of producing a flexible substrate on which it is possible to produce wetting contrasts. Wetting contrasts consist of areas of differing hydrophilicity and/or oleophilicity. For the purposes of this invention, hydrophilicity of a surface is measured via its contact angle with water, whilst oleophilicity is measured via contact angles with hexane, that is the angle between a given surface and a droplet of a designated amount of the relevant liquid. Such contact angle measurements are well-known in the art, and measurements can be made using e.g. a goniometer (contact angle measuring device) to measure droplets of 1-5 µl on a surface of interest. Preferably, the wetting contrast in the substrates of the present invention have adjacent surface areas whose contact angles with water and/or hexane differ by more than 60°, preferably more than 80° and most preferably more than 100°.

For the purposes of the present invention, the word "hydrophilic" is used to describe surfaces having a contact angle with water of less than 60°. The phrase "very hydrophilic" is used to describe surfaces having a contact angle with water of less than 20°. The phrase "super-hydrophilic" is used to describe surfaces having a contact angle with water of less than 5°.

The word "hydrophobic" is used to describe surfaces having a contact angle with water of more than 60°. The phrase "very hydrophobic" is used to describe surfaces having a contact angle with water of more than 90°. The phrase "super-hydrophobic" is used to describe surfaces having a contact angle with water of more than 120°.

The word "oleophilic" is used to describe surfaces having a contact angle with hexane of less than 60°. The phrase "very oleophilic" is used to describe surfaces having a contact angle with hexane of less than 20°. The phrase "super-oleophilic" is used to describe surfaces having a contact angle with hexane of less than 5°. The word "oleophobic" is used to describe surfaces having a contact angle with hexane of more than 60°. The phrase "very oleophobic" is used to describe surfaces having a contact angle with hexane of more than 90°. The phrase "super-oleophobic" is used to describe surfaces having a contact angle with hexane of more than 120°.

The research of the present inventors has led them to find that a convenient way of achieving good wetting contrasts which consist of adjacent areas of greatly differing hydrophilicity and/or oleophilicity is to impart glass-like chemical properties to at least parts of a flexible polymer foil. This allows the chemical treatment steps known from the processing of conventional rigid inorganic oxide substrates to increase a wetting contrast to be used to create areas of different hydrophilicity and/or oleophilicity also on a flexible substrate. Thus, the present invention in its simplest form is realised by applying an inorganic oxide to at least parts of a flexible polymer substrate precursor in a manner so that the inorganic oxide is securely attached and can withstand flexing of the underlying substrate precursor. This can for example be achieved by depositing a thin layer of inorganic oxide on a substrate precursor, e.g. by vapour deposition or chemical deposition. Alternatively, it can be achieved by forming a mixture of inorganic particles and a polymer matrix on the substrate precursor and then removing the surface polymer (e.g. by plasma etching) to reveal the underlying inorganic material. Another way of achieving this is to adhere particulate inorganic material to the surface of the substrate precursor.

However, the contribution of the present inventors goes beyond this, in that they have also discovered that, by varying the concentration of inorganic material exposed at the surface (e.g. by varying the vol. % in which inorganic particles are comprised in the polymer matrix where a mixture of inorganic oxide particles and a polymer matrix is used) it is possible to vary the extent to which the surface behaves like the polymer and like the inorganic material in terms of its response to various chemical treatments. Where the inorganic material is present in a high concentration at the surface (e.g. corresponding to 40-60 vol. % of inorganic material in the polymer matrix mixture relative to the total amount of polymer and inorganic particles where this technique is used), the surface behaves much like an inorganic surface. Where the inorganic material is present in a low concentration (e.g. corresponding to 0-20 vol. % of inorganic material in the polymer matrix mixture relative to the total amount of polymer and inorganic particles where this technique is used), the surface behaves much like a polymer surface. Where the inorganic material is present in an intermediate amount (e.g. corresponding to 20-40 vol. % of inorganic material in the polymer matrix mixture relative to the total amount of polymer and inorganic particles where this technique is used), the surface behaves neither like the polymer or the inorganic material but rather displays an intermediate behaviour.

In particular, where a polymer matrix comprising a relatively small amount of inorganic particles is used, it is possible to control the chemical behaviour of the surface. The pristine matrix will have very little inorganic material present at the surface and will therefore behave chemically much like the polymer alone. Plasma etching or other treatment to remove surface polymer will reveal the underlying inorganic material, so that eventually this will dominate the chemical behaviour of the surface.

In addition to being able to control the behaviour of the inorganic material-containing surface, it is also possible to select various different polymeric substrate precursors, which respond differently to various chemical treatments.

It is also possible to deposit further layers of polymer onto parts of the inorganic material regions of the substrate or to mask areas of the substrate before subjecting it to chemical treatment, so that only selected areas of the substrate are chemically modified.

Using these techniques, it is possible to produce a substrate which has a desired wetting contrast.

In Table 1 below, the hydrophilicities and/or oleophilicities of various substances are set out. Table 1 also indicates the change in hydrophilicity and/or oleophilicity achievable by various chemical treatments.

TABLE 1

|  | No treatment | $CF_4$ plasma treatment | $O_2$ plasma treatment | Fluoroalkyl-silane treatment |
|---|---|---|---|---|
| $SiO_2$ | Hydrophilic | Super-Hydrophilic | Super-Hydrophilic | Very Hydrophobic (smooth $SiO_2$ surfaces) or Super-Hydrophobic |

TABLE 1-continued

|  | No treatment | CF$_4$ plasma treatment | O$_2$ plasma treatment | Fluoroalkyl-silane treatment |
|---|---|---|---|---|
|  |  |  |  | (rough SiO$_2$ surfaces) & Oleophobic |
| Polymethyl-methacrylate (PMMA) | Hydrophobic & Oleophilic | Hydrophobic & Oleophilic | Very Hydrophilic | — |
| PMMA + SiO$_2$ (small amount of SiO$_2$ on surface) | Hydrophobic & Oleophilic | Hydrophobic & Oleophilic | Very Hydrophilic | — |
| PMMA + SiO$_2$ (large amount of SiO$_2$ on surface) | Very Hydrophobic & Oleophilic | Super Hydrophilic | Super Hydrophilic | Super-Hydrophobic & Oleophobic |

In the following paragraphs, possible substrate precursors, possible inorganic oxides and other inorganic materials, possible matrix polymers, possible methods of oxide deposition, substrate flexibility and various chemical treatments of substrates to produce various wetting contrasts will be explained in more detail. Furthermore, the use of the substrates in producing microelectronic components is discussed. Then, specific embodiments of the present invention will be described with reference to the drawings, in which.

SUBSTRATE, SUBSTRATE PRECURSOR AND MODIFIED SUBSTRATE

In the present invention, the substrate is a product having a wetting contrast (i.e. two adjacent surface areas which have different hydrophilicities and/or oleophilicities).

In the context of the present invention, the term "substrate" is not limited to the actual substrate used for instance in the production of a semiconductor element. Rather, "substrate" in this context is intended to encompass any material on which a further element, e.g. an electronically functional element, is formed which includes surfaces already coated and/or patterned with e.g. conductors, semiconductors or insulators as intermediate products in the fabrication of e.g. electronic devices such as transistors.

The substrate precursor is a material which can be processed to form the substrate.

The modified substrate refers to a substrate which has been chemically treated to increase the difference in hydrophilicity and/or oleophilicity between the adjacent areas, relative to the corresponding areas of the untreated substrate.

In order for the substrate or modified substrate to be useful in reel-to-reel processing, it must be flexible. Therefore, the substrate precursor must also be flexible. Other than this requirement, the nature of the substrate precursor is not important, especially if none of the precursor material is present on the surface of the substrate or modified substrate. On the other hand, it may be that the substrate precursor is not entirely covered in the substrate or modified substrate product, in which case its chemical nature, and in particular its hydrophilicity and/or oleophilicity and susceptibility to changes in hydrophilicity and/or oleophilicity by various chemical treatments will be important.

Specific examples of substrate precursors which can be used include metal foils (e.g. aluminium or steel) and polymer foils produced from polyimide (PI), polyethylene terephthalate (PET), polyethylene naphthalate (PEN), polycarbonate (PC), polynorbornene (PNB) and polyethersulfone (PES).

Where it is desired to use a hydrophilic precursor, foils made from or coated with e.g. a thin metal layer (e.g. aluminium or steel), regenerated celluloses, polyvinyl alcohol, polyvinylphenol (PVP) or polyvinylpyrrolidone can be used.

Where it is desired to use a hydrophobic precursor, polymers such as polyimide (PI), polyethylene terephthalate (PET), polyethylene naphthalate (PEN), polycarbonate (PC), polynorbornene (PNB) and polyethersulfone (PES) can be used.

Substrate Flexibility

As discussed above, the substrates, modified substrates and substrate precursor of the present invention must be flexible. In the context of the present invention, this means that the substrate must be rollable so that it can for example be used in reel-to-reel processing. Therefore, it is preferably possible to roll the substrate to form a roll having a diameter of 10 meters or less. More preferably, it is possible to roll the material to form a roll having a diameter of 5 meters or less, even more preferably 2 meters or less, most preferably 1 meter or less.

Inorganic Materials

In the present invention, it is in principle possible to use any inorganic material provided that it has appropriate properties for producing the desired wetting contrast. The inorganic material used is preferably an inorganic oxide. For the purposes of the present invention, the term "inorganic oxide" is taken to encompass non-organic materials which are solid at room temperature and at ambient pressure and which have an oxygen atom. Thus minerals containing oxygen atoms are for the purposes of the present invention classed as inorganic oxides, as are the solid oxides of metals (e.g. aluminium and titanium) and the solid oxides of semi-metals (e.g. silicon). Inorganic oxides which can be used include binary oxides (such as silicon dioxide ($SiO_2$), aluminium oxide ($Al_2O_3$), titanium dioxide ($TiO_2$), tin oxide ($SnO_2$) and tantalum pentoxide ($Ta_2O_5$)), ternary oxides (such as indium tin oxide (ITO) and perovskites (e.g. $CaTiO_3$ or $BaTiO_3$)) and quaternary oxides such as zeolites ($M^{n+}_{x/n}[(AlO_2)_x(SiO_2)_y] \cdot MH_2O$).

Furthermore, in addition to the above-mentioned oxides, any material or material combination that turns hydrophilic upon exposure to $O_2$ plasma and/or $CF_4$ plasma (by initial formation of a fluorine terminated surface that reacts with water to form a hydroxy-terminated surface) may be used. Specific examples include elemental metals or semiconductors such as aluminium, tin, titanium, aluminium-copper alloys, silicon and germanium; metal chalcogenides such as tin sulphide and tungsten selenide; metal nitrides such as boron nitride, aluminium nitride, silicon nitride and titanium nitride; metal phosphides such as indium phosphide; metal carbides such as tungsten carbide; and metal silicides such as copper silicide.

Deposition Methods

In the present invention, it is not significant how the inorganic material is deposited on the surface of the substrate precursor. Possible methods of deposition include vapour deposition, chemical deposition and inclusion of particles of inorganic material at the surface, for example in a polymer matrix. In view of the importance of the substrate being able to flex without being damaged, it is generally preferable for the inorganic material to be included as particles which are present at least on the surface. This can be achieved for example by distributing inorganic particles throughout a substrate precursor from which the substrate is then produced.

Alternatively, the precursor may be coated with a polymer matrix comprising the inorganic particles, e.g. by spin-coating and subsequently etching away part of the polymer surface to reveal the underlying inorganic particles and thus form the substrate. Where this technique is used, the polymer and inorganic material are preferably pre-mixed together with a solvent to form a coating composition. The solvent may be any appropriate solvent, e.g. butylacetate. Etching of the coated precursor can for example be achieved by plasma etching. Where this technique is used, the polymer matrix is preferably chosen from materials already used in the field of preparing substrates for use in the preparation of microelectronic components in view of the fact that skilled workers are already familiar with such materials. Currently used materials include polyimides (PI), benzocyclobutene (BCB), epoxy-based negative resists (e.g. SU-8), photo-initiated curing acrylates (e.g. Delo-photobond), polyacrylates (e.g. polymethylmethacrylate, PMMA), polymethylglutarimide (PMGI) and polyvinylphenol. The mixture of the polymer matrix, the inorganic particles and the solvent may for example be prepared by mechanical mixing or using ultrasound. Preferably, the inorganic particles constitute 10-70 vol. % of the mixture, more preferably 20-60, most preferably 30-40 vol. % relative to the total amount of polymer and inorganic particles.

Depending on the details of the method of production of the substrate, it may in some cases be preferable to use a precursor obtainable by coating a substrate base with a mixture comprising only a relatively small amount of inorganic particles, for example 10-30, more preferably 15-25 vol. % relative to the total amount of polymer and inorganic particles. In other applications it may be more preferable to use a precursor obtainable by coating a substrate base with a mixture having a relatively high content of the inorganic particles, e.g. 40-60 vol. %, more preferably 45-55 vol. % relative to the total amount of polymer and inorganic particles. As explained above, the concentration of the inorganic particles in the polymer matrix is one factor which controls the extent to which a surface behave like a glass surface or like a polymer surface, the other factor being the extent to which the polymer is etched away to reveal the underlying inorganic particles.

Instead of coating the precursor with a polymer matrix comprising the inorganic particles, it is also possible according to the present invention to form the inorganic particles in situ. This could be done for example by depositing on a precursor a substance in which inorganic particles will be formed, the formation of these particles being triggered e.g. by the drying process or by exposure to a particular reagent. This method of producing the substrates used in the present invention is particularly preferable where it is intended to deposit the inorganic-particle layer by ink-jet printing; it is often problematic to ink-jet print ink solutions which comprise large, micron-sized (75 microns) particles because this tends to clog the printer head. An example of a system which would allow the formation of inorganic particles in situ would be the deposition of a solution of a polymer matrix (e.g. PMMA) and a compound of the formula $Si(OR)_4$ wherein R is a $C_1$-$C_6$ alkyl group such as an ethyl group in a suitable solvent such as butylacetate. Such a polymer solution comprises no particles as such, although $SiO_2$ particles are formed when the polymer and silicon-compound mixture is exposed to water, e.g. atmospheric water vapour. Another way of depositing inorganic particles on a precursor is to distribute a particulate inorganic material onto an adherent precursor surface, for example by applying adhesive and then the inorganic material to the surface, or by heating the precursor surface to melt it and then distributing inorganic particles onto the molten surface so that the particles become fixed thereto on cooling.

It is generally preferable to use an inorganic material in the particulate form, not only because the resulting substrates are more robust and less prone to breaking when flexed, but also because this allows control of the concentration of the inorganic material on the surface, which allows control of the chemical properties of the surface layer. Furthermore, the use of particulate inorganic material is preferable because it increases the surface area of the substrate surface by making it rougher. This affects the surface properties of the substrate, increasing a substrate's philicity or phobicity to a particular solvent. Thus, roughening a surface renders a hydrophilic surface more hydrophilic, a hydrophobic surface more hydrophobic, an oleophilic surface more oleophilic, and an oleophobic surface more oleophobic. This is useful when producing substrates with wetting contrasts whose areas differ greatly in hydrophilicity and/or oleophilicity.

When using particulate inorganic materials, the particles preferably have an average particle size as measured by Transmission Electron Microscopy (TEM) of less than 5 µm, more preferably less than 0.5 µm, most preferably less than 0.05 µm. The particles are preferably nanoparticles having an average size in the range 5-1000 nm, more preferably 5-100 nm, most preferably 10-20 mm. Such small particles are preferable for a number of reasons:

Firstly, small particles result in better optical quality of the resulting substrates. For particle sizes smaller than the wavelength of the visible light, light scattering is avoided and a clear particle-polymer composite film can be obtained. This is important where the substrate is used in display applications.

Secondly, small particles result in an appropriate roughness of the surface layer. Nanoparticles are preferable to micron-sized particles, as the latter result in a surface roughness of the composite film on a scale corresponding to the particle sizes. Although it is generally preferable for a substrate to have a rough surface for the reasons discussed above, there is a limit to how rough a surface can be and still allow appropriate end products (e.g. microelectronic components)

to be produced. Substrates for microelectronic applications should have a surface roughness below the required pattern sizes. Therefore, the use of nanoparticles allows the surface area of the substrate surface to be increased without roughening the surface to the extent that further processing becomes difficult.

Thirdly, small particles are preferably used in view of the chemical homogeneity of the substrate. In order to achieve high-resolution patterning by ink-jet printing, the lateral variations in the surface composition, which result in a corresponding variation of the surface energy, should preferably be on a scale smaller than the required pattern sizes.

Chemical Treatments

When substrates of the present invention are subjected to various chemical treatments, it is possible to change the hydrophilicities and/or oleophilicities of the various materials present at the surface. This allows a substrate to be modified so that an appropriate wetting contrast is available for the intended use. Whilst many types of chemical treatment could in principle be used, only the following three types of treatment are discussed in detail: (i) fluorination treatment, (ii) oxidation treatment and (iii) fluoroalkylsilane treatment.

(i) Fluorination Treatment

Fluorination of a surface is achieved by chemical treatment, for example with $SF_6$ or $CF_4$ plasma.

Treatment by exposure of a surface to $CF_4$ plasma fluorinates even relatively unreactive moieties on that surface. Thus, for example, where an alkyl moiety is present on the surface, it will become fluorinated. As fluorocarbon moieties are hydrophobic and oleophobic, fluorination of common polymer materials such as polymethylmethacrylate (PMMA), polyimide (PI) and polyethylene terephthalate (PET) will render them hydrophobic and oleophobic.

In contrast, fluorination of an inorganic surface will result in the formation of the corresponding inorganic fluorides, which are most often reactive towards nucleophiles such as water molecules and form a hydrophilic hydroxyl-terminated surface upon exposure to water. For example, fluorination of $SiO_2$ results in the formation of Si—F bonds. Si—F bonds are relatively unstable, and are converted to Si—OH groups when exposed to moist air or water.

Where a polymer matrix comprising an inorganic material is exposed to $CF_4$ plasma, the concentration of inorganic particles at the surface is important in determining whether the surface is rendered hydrophilic or hydrophobic and oleophobic. A large concentration of inorganic particles at the surface will make the material behave more like the inorganic material and less like the matrix material, yielding a hydrophilic surface on fluorination. In contrast, where only a low surface concentration of the inorganic particles is present, the material will act more like the matrix polymer and will yield a hydrophobic and oleophobic surface upon fluorination. Prolonged exposure of a low concentration matrix of inorganic particles to $CF_4$ plasma will tend to make the surface more hydrophilic, as the matrix material becomes etched away by the plasma revealing a greater surface area of the inorganic particles. Treatment of hydroxylated groups with $CF_4$ plasma effectively replaces the —OH moieties with —F moieties, probably by etching away the surface layer containing the OH-bonds and providing a newly formed surface which is F-terminated. Whilst $CF_4$ plasma treatment is often used in laboratory scale production of wetting contrasts on inorganic substrates, it is preferable not to use such steps in commercial manufacture of these as a vacuum chamber is required to carry out plasma treatment. This is generally not practical in a factory setting, and adds expenditure.

(ii) Oxidation Treatment

Oxidation of a surface is achieved by chemical treatment, for example with $O_2$ plasma, ozone/UV or by corona discharge treatment in air.

Treatment by exposure of a surface to $O_2$ plasma oxidises even relatively unreactive moieties on that surface. Thus, for example, where an alkyl moiety is present on the surface, it will become oxidised, forming hydroxyl, carbonyl, and carboxylic acid groups. As hydroxyl and carboxylic acid moieties are hydrophilic, oxidation of common polymer materials such as polymethylmethacrylate (PMMA), polyimide (PI), and polyethylene terephthalate (PET), will render them hydrophilic.

Exposure of an inorganic material to $O_2$ plasma similarly introduces hydrophilic hydroxyl groups after exposure to atmospheric moisture or water.

Thus, oxidation treatment, e.g. by exposure to $O_2$ plasma, renders both inorganic materials and polymers hydrophilic. It follows that also exposure to a surface comprising an inorganic material and a matrix polymer results in a hydrophilic surface, regardless of the surface concentration of the inorganic material. Whilst $O_2$ plasma treatment is often used in laboratory scale production of wetting contrasts, it is preferable not to use such steps in commercial manufacture of these as a vacuum chamber is required to carry out plasma treatment. This is generally not practical in a factory setting, and adds expenditure. Alternatives include UV-ozone or corona (electrical discharge) treatments.

(iii) Fluoroalkylsilane Treatment

Treatment of a surface, for example by exposure to a material such as (heptadecafluorodecyl)-trichlorosilane ($CF_3(CF_2)_7CH_2CH_2SiCl_3$) in hexane results in the grafting of fluoroalkylsilane molecules onto reactive moieties on the surface such as hydroxyl groups. Thus fluoroalkylsilane molecules become grafted to the surface oxygen atoms of an inorganic surface treated with e.g. (heptadecafluorodecyl)-trichlorosilane ($CF_3(CF_2)_7CH_2CH_2SiCl_3$) in hexane. This renders the surface super-hydrophobic and oleophobic. Where an inorganic material has no moieties which are reactive towards fluoroalkylsilanes, an oxidation treatment may be required before exposure to the fluoroalkysilane.

Exposure of a pristine polymer to a fluoroalkylsilane treatment has no effect, as C—H bonds are not reactive towards trichlorosilanes under the reaction conditions usually applied for silanisations. It is possible to graft fluoroalkylsilanes to an oxidised polymer that contains hydroxyl moieties, for example a polymer oxidised by exposure to $O_2$ plasma. However, the C—O—Si bonds which are formed are easily cleaved by hydrolysis or reaction with other nucleophiles. For this reason, a fluoroalkylsilane treatment is generally not used to render polymer surfaces hydrophobic and oleophobic and their use is in practice restricted to the modification of inorganic oxide substrates.

The effect of silanisation with a fluoroalkylsilane of a polymer matrix comprising inorganic particles depends on the concentration of inorganic hydroxyl groups at the surface. Where the concentration is high, the surface is rendered super-hydrophobic and oleophobic. The less inorganic hydroxyl groups there are present at the surface, the less this is observed.

Producing Flexible Substrates Having Hydrophilic vs. Hydrophobic and Oleophobic Wetting Contrasts The present invention provides several specific ways in which flexible substrates having hydrophilic vs. hydrophobic/oleophobic wetting contrasts can be produced.

Figure 1:
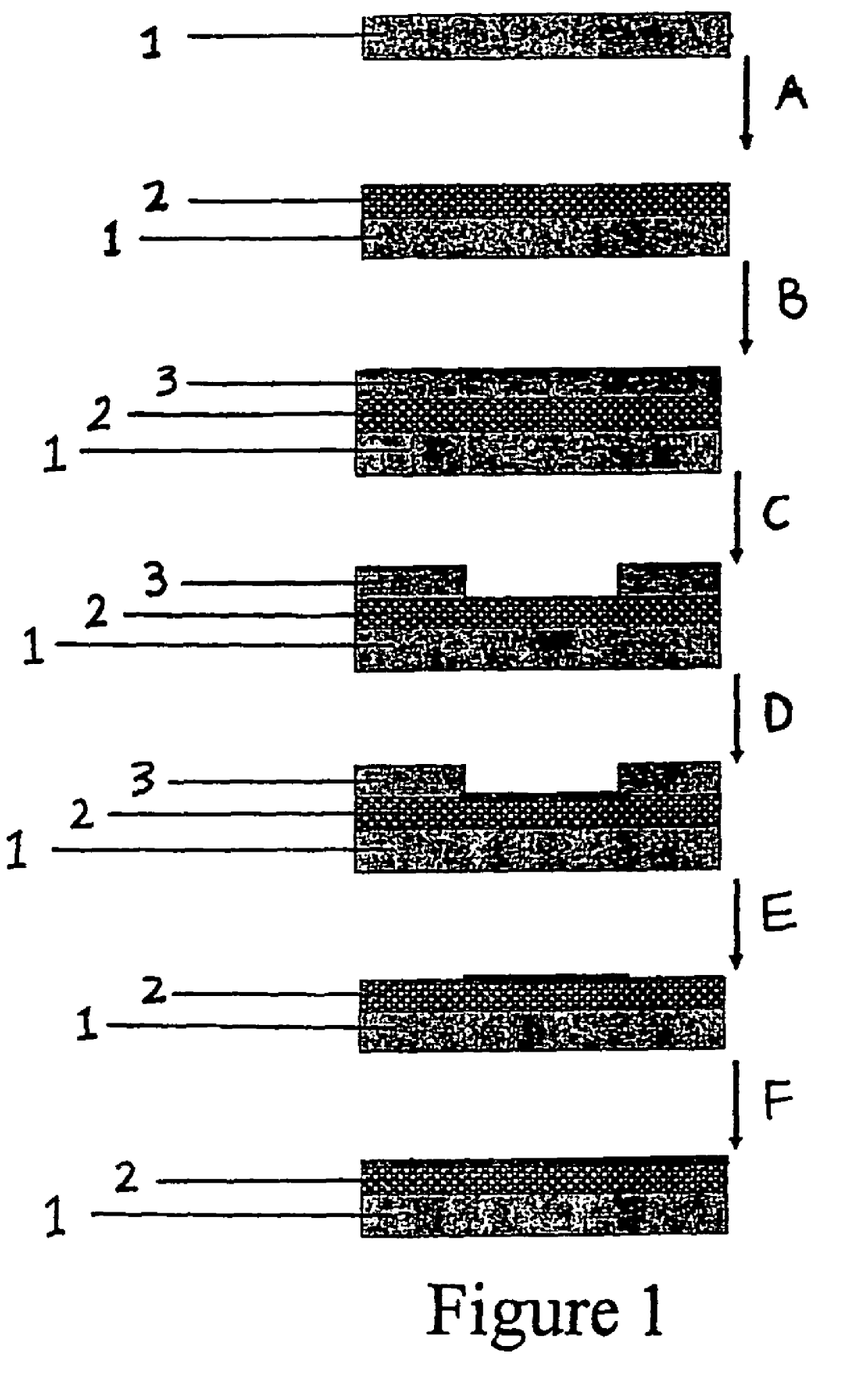
FIG. 1. schematically depicts a first method of realising the method of the present invention.

According to a first method depicted schematically in FIG. 1, a flexible substrate having a hydrophilic vs. hydrophobic and oleophobic wetting contrast is prepared by coating a flexible polymer substrate precursor (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a polymer (2) (e.g. polymethylmethacrylate (PMMA)), particles (e.g. nanoparticles of average particle size 10-20 nm) of an inorganic material (e.g. $SiO_2$) and a solvent (e.g. butylacetate) (Step A). The inorganic material may for example be present in an amount of 20 vol. % relative to the total amount of polymer and inorganic particles. For example, a 1 μm thick layer of polymer matrix and inorganic particles could be applied to the substrate precursor by spin-coating or doctor-blading. The coated substrate precursor is then left to dry, to form the substrate.

Subsequently, the substrate is coated with a photoresist material (3) (e.g. by spin-coating a Shipley photoresist S1800 series) (Step B) which is then removed in a pattern as desired (e.g. using UV exposure through a photomask, followed by a photoresist development with MF 319 developer) to reveal a pattern of the underlying polymer and inorganic material layer (Step C). Then, the surface is exposed to a prolonged surface oxidation treatment (e.g. by $O_2$ plasma for 20 seconds at a flow-rate of 200 ml/min and at a power of 200 W) which strips away a portion of the polymer matrix surrounding the inorganic particles, thus revealing the inorganic particles at the surface and rendering the treated part of the surface hydrophilic (Step D). Next, the photoresist (3) is removed (e.g. by Microposit remover 1165) (Step E). In a final step (Step F), the entire surface of the substrate is exposed to a short $CF_4$ plasma treatment (e.g. 7 seconds at a flow-rate of 200 ml/min and at a power of 200 W), which retains the hydrophilicity of the patterned areas which are high in surface inorganic material concentration and renders the unpatterned areas which are low in surface inorganic material concentration hydrophobic and oleophobic.

Figure 2:
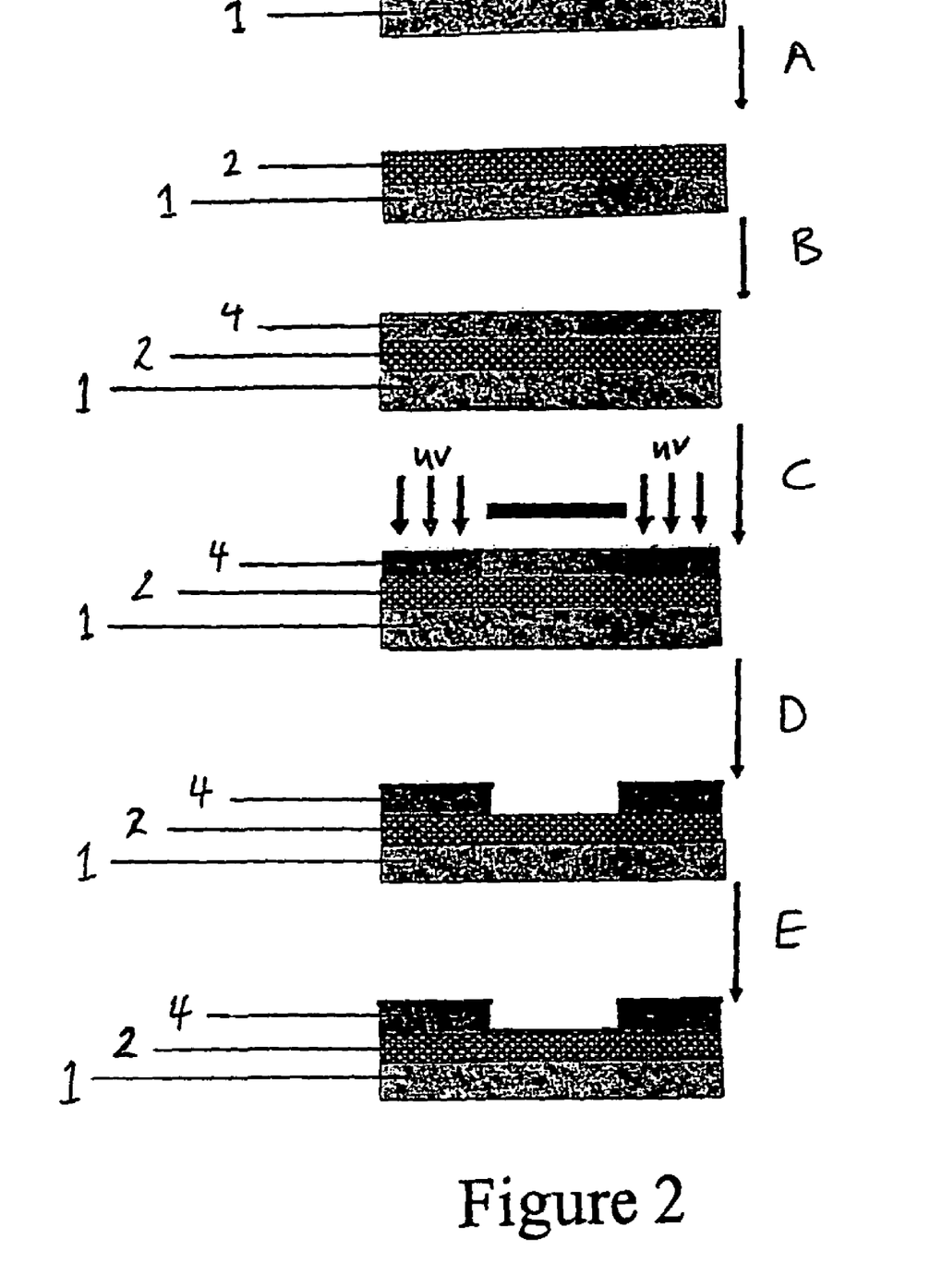
FIG. 2. schematically depicts a second method of realising the method of the present invention.

According to a second method, depicted schematically in FIG. 2, a flexible substrate having a hydrophilic vs. hydrophobic and oleophobic wetting contrast is prepared by coating a flexible polymer substrate precursor (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a polymer (2) (e.g. PMMA), particles (e.g. nanoparticles of average particle size 10-20 nm) of an inorganic material (e.g. $SiO_2$) and a solvent (e.g. butylacetate) (Step A). The inorganic material may for example be present in an amount of 50 vol. % relative to the total amount of polymer and inorganic particles. For example, a 1 μm thick layer of polymer matrix and inorganic particles could be applied to the substrate precursor by spin-coating or doctor-blading. The coated substrate precursor is then left to dry, to form the substrate.

The substrate is coated with a polymer (4) (e.g. polyvinylpyrrolidone) comprising a crosslinker (e.g. a UV crosslinker such as divinylbenzene) (Step B). The polymer coating may be applied in a thickness of e.g. 2 μm, and the crosslinker may be comprised in an amount of e.g. 2-5 wt. %. The polymer coating is then selectively exposed to crosslinking conditions (e.g. UV light where a UV crosslinker is used) in a patterned area (Step C) The surface is then washed with an appropriate solvent (e.g. water where a polyvinylpyrrolidone polymer is used) to remove to the polymer (4) from areas which were not crosslinked (Step D). The underlying polymer (2) and inorganic material layer will thus be exposed in these areas. Subsequently, the surface is fluorinated (e.g. by exposure to $CF_4$ plasma for 7 seconds at a flow-rate of 200 ml/min and at a power of 200 W), which renders the crosslinked polymer areas (4) hydrophobic/oleophobic and renders the polymer (2) and inorganic material layer hydrophilic (Step E).

Figure 3:
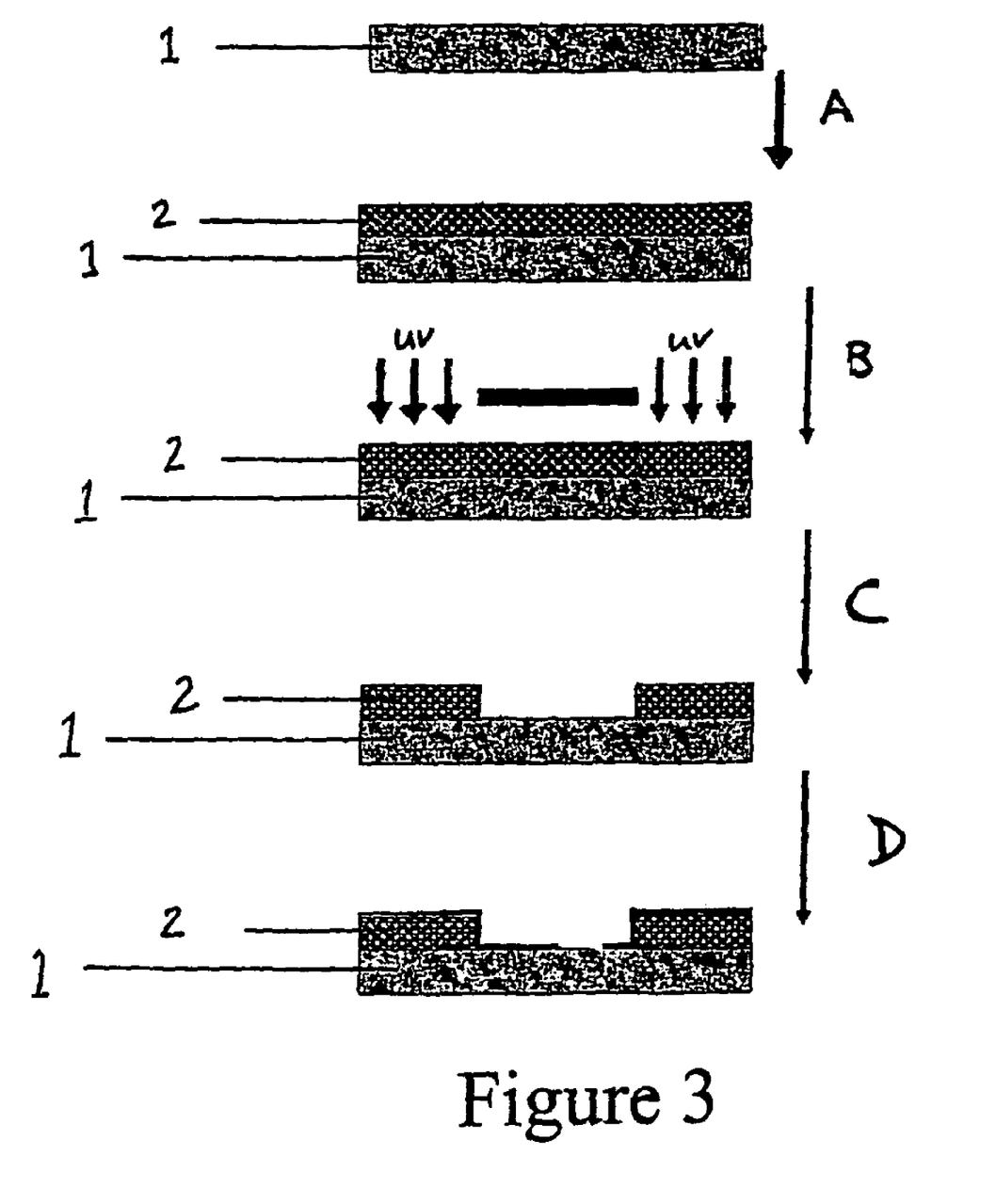
FIG. 3. schematically depicts a third method of realising the method of the present invention.

According to a third method, depicted schematically in FIG. 3, a flexible substrate having a hydrophilic vs. hydrophobic and oleophobic wetting contrast is prepared by coating a flexible polymer substrate precursor (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a photocrosslinkable polymer (2) (e.g. polystyrene), particles (e.g. nanoparticles of average particle size 10-20 nm) of an inorganic material (e.g. $SiO_2$), a crosslinker (e.g. a UV crosslinker such as divinylbenzene) and a solvent (e.g. butylacetate) (Step A). The inorganic material may for example be present in an amount of e.g. 50 vol. % relative to the total amount of polymer and inorganic particles. The crosslinker may for example be present in an amount of e.g. 5 wt. % of the composition. For example, a 2 μm thick layer of polymer matrix and inorganic material could be applied to the substrate precursor by spin-coating or doctor-blading. The coated substrate precursor is then left to dry, to form the substrate.

The substrate is then selectively exposed to crosslinking conditions (e.g. UV light where a UV crosslinker is used) in a patterned area (Step B). The surface is then washed with an appropriate solvent (e.g. mesitylene where polystyrene is used) to remove to the polymer (2) and inorganic material from areas which were not crosslinked, to reveal the underlying polymer substrate precursor (1) (Step C). Subsequent treatment of the surface with $CF_4$ plasma (e.g. by exposure to $CF_4$ plasma for 7 seconds at a flow-rate of 200 ml/min and at a power of 200 W) renders the polymer precursor areas (1) hydrophobic and oleophobic, but removes the top layer of polymer from the inorganic material-containing polymer (2) layer to reveal the inorganic particles at the surface and render it hydrophilic (Step D).

Figure 4:
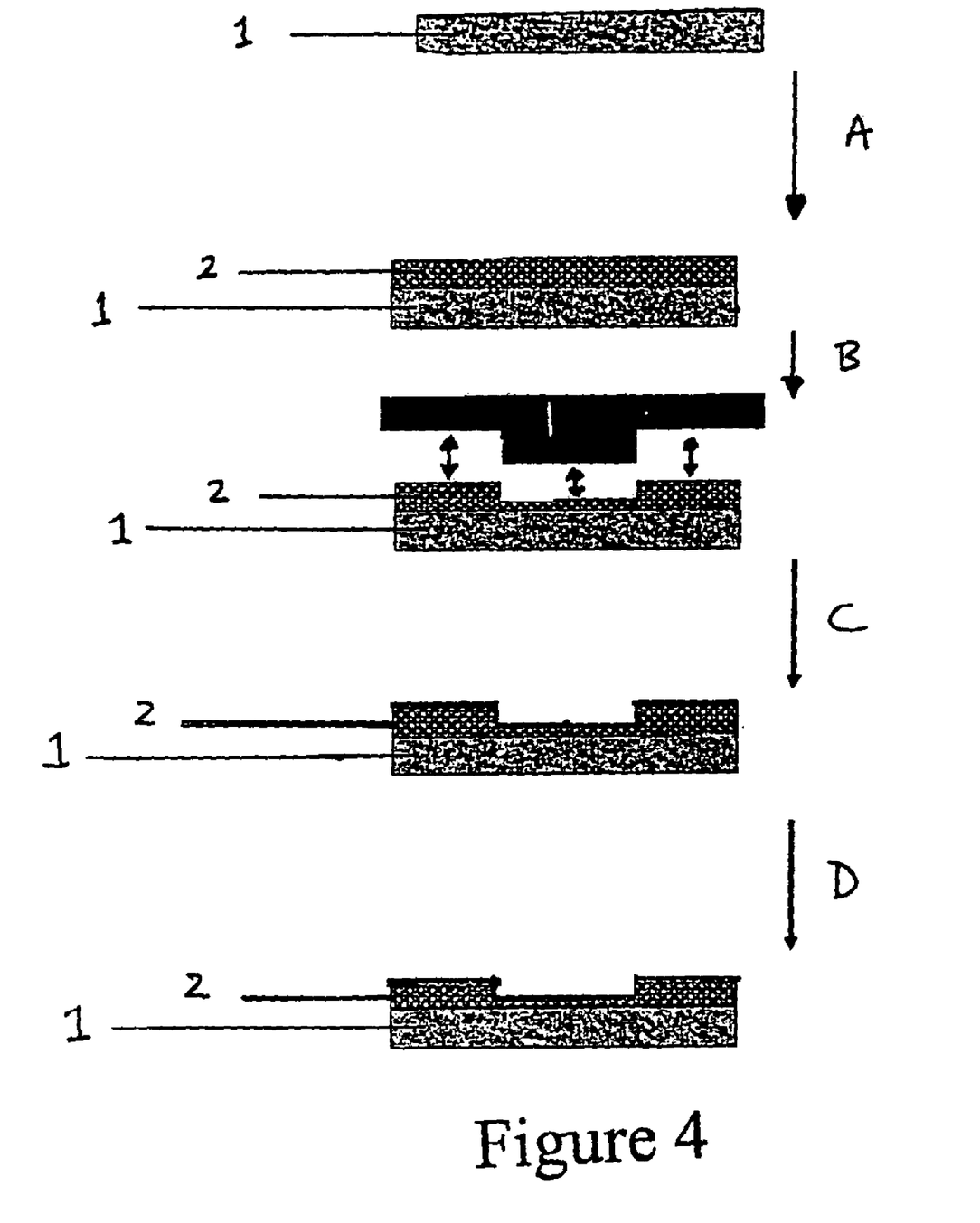
FIG. 4. schematically depicts a fourth method of realising the method of the present invention.

According to a fourth method, depicted schematically in FIG. 4, a flexible substrate is prepared by coating a flexible polymer substrate precursor (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a polymer (2) (e.g. PMMA), particles (e.g. nanoparticles of average particle size 10-20 nm) of an inorganic material (e.g. $SiO_2$) and a solvent (e.g. butylacetate) (Step A). The inorganic material may for example be present in an amount of 50 vol. %. For example, a 2 μm thick layer of polymer matrix and inorganic material could be applied to the substrate precursor by spin-coating or doctor-blading. The coated substrate precursor is then left to dry, to form the substrate.

The substrate is then micro-embossed to form a patterned area where the polymer layer (2) is compressed (Step B). This can for example be achieved using a hard stamp at a temperature above the glass transition temperature of the matrix polymer. The surface is then oxidised (e.g. by exposure to $O_2$ plasma for 7 seconds at a flow-rate of 200 ml/min and at a power of 200 W) to render the entire surface hydrophilic (Step C). A fluoroalkylsilane (e.g. heptadecafluorodecyl)-trichlorosilane) is then applied to the surface areas which were not embossed, by application e.g. via a non-patterned (flat) polydimethylsiloxane (PDMS) stamp (Step D). This renders the unembossed (surface) areas hydrophobic and oleophobic.

Figure 5:
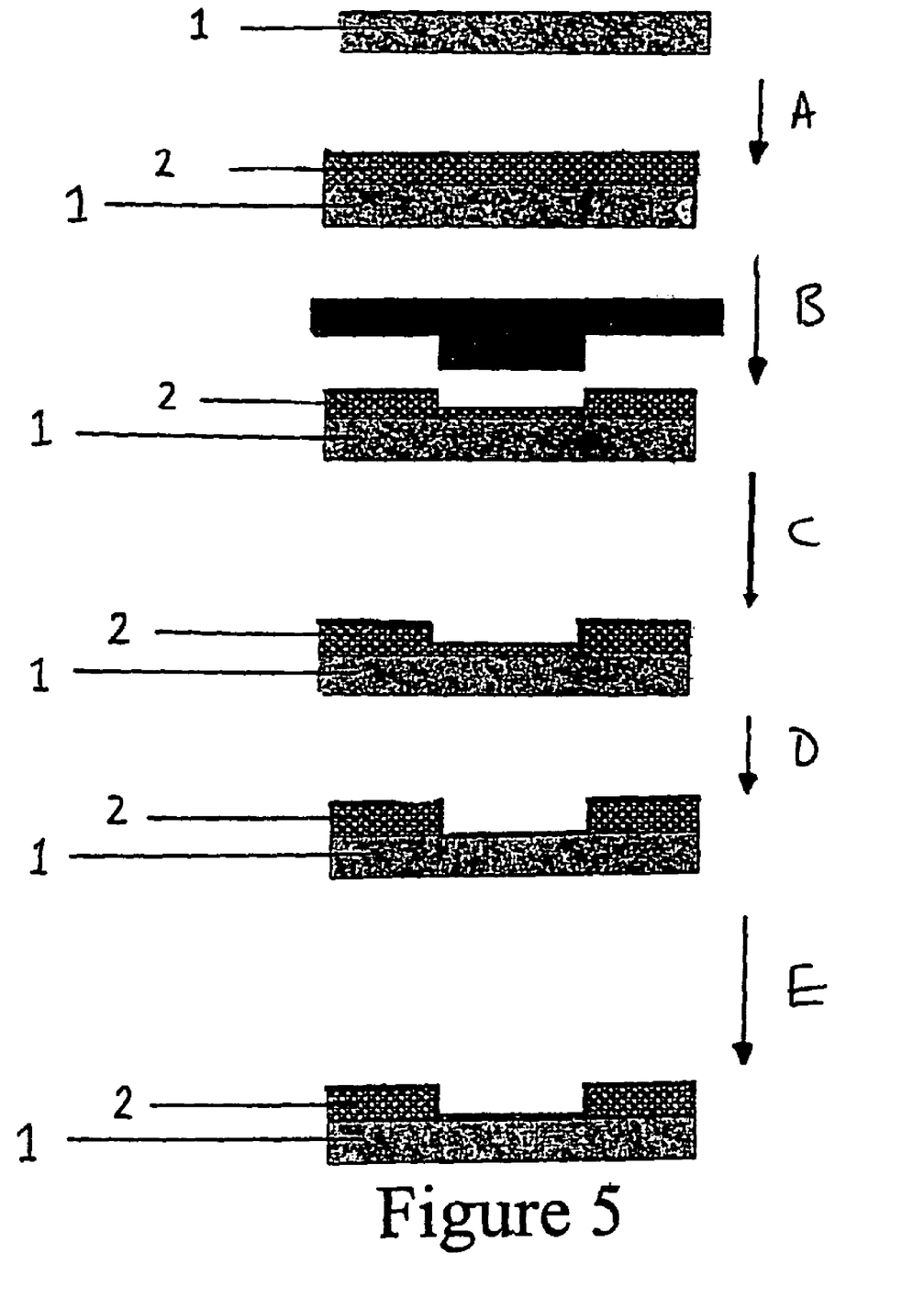
FIG. 5. schematically depicts a fifth method of realising the method of the present invention.

According to a fifth method, depicted schematically in FIG. 5, a flexible substrate having a hydrophilic vs. hydrophobic and oleophobic wetting contrast is prepared by coating a flexible polymer substrate precursor (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a polymer (2) (e.g. PMMA), particles (e.g. nanoparticles of average particle size 10-20 nm) of an inorganic material (e.g. $SiO_2$) and a solvent (e.g. butylacetate) (Step A). The inorganic material may for example be present in an amount of 50 vol. % relative to the total amount of polymer and inorganic particles. For example, a 2 μm thick layer of polymer matrix & inorganic material could be applied to the substrate precursor by spin-coating or doctor-blading. The coated substrate precursor is then left to dry, to form the substrate.

The substrate is then micro-embossed (e.g. using a hard stamp at a temperature above the glass transition temperature of the matrix polymer) to form a patterned area where the polymer layer (2) is compressed (Step B). The surface is then oxidised (e.g. by exposure to $O_2$ plasma for 7 seconds at a flow-rate of 200 ml/min and at a power of 200 W) to render the entire surface hydrophilic (Step C). Then, the polymer (2) and inorganic material layer is removed from the embossed areas (e.g. by de-scumming treatment with a mixed $O_2/CF_4$ plasma for 1 minute at a flow-rate of 200 ml/min and at a power of 200 W) to expose the precursor in the embossed areas (Step D). Subsequent exposure of the surface to $CF_4$ plasma renders the exposed precursor hydrophobic and oleophobic, while the non-embossed areas are rendered hydrophilic (Step E).

Figure 6:
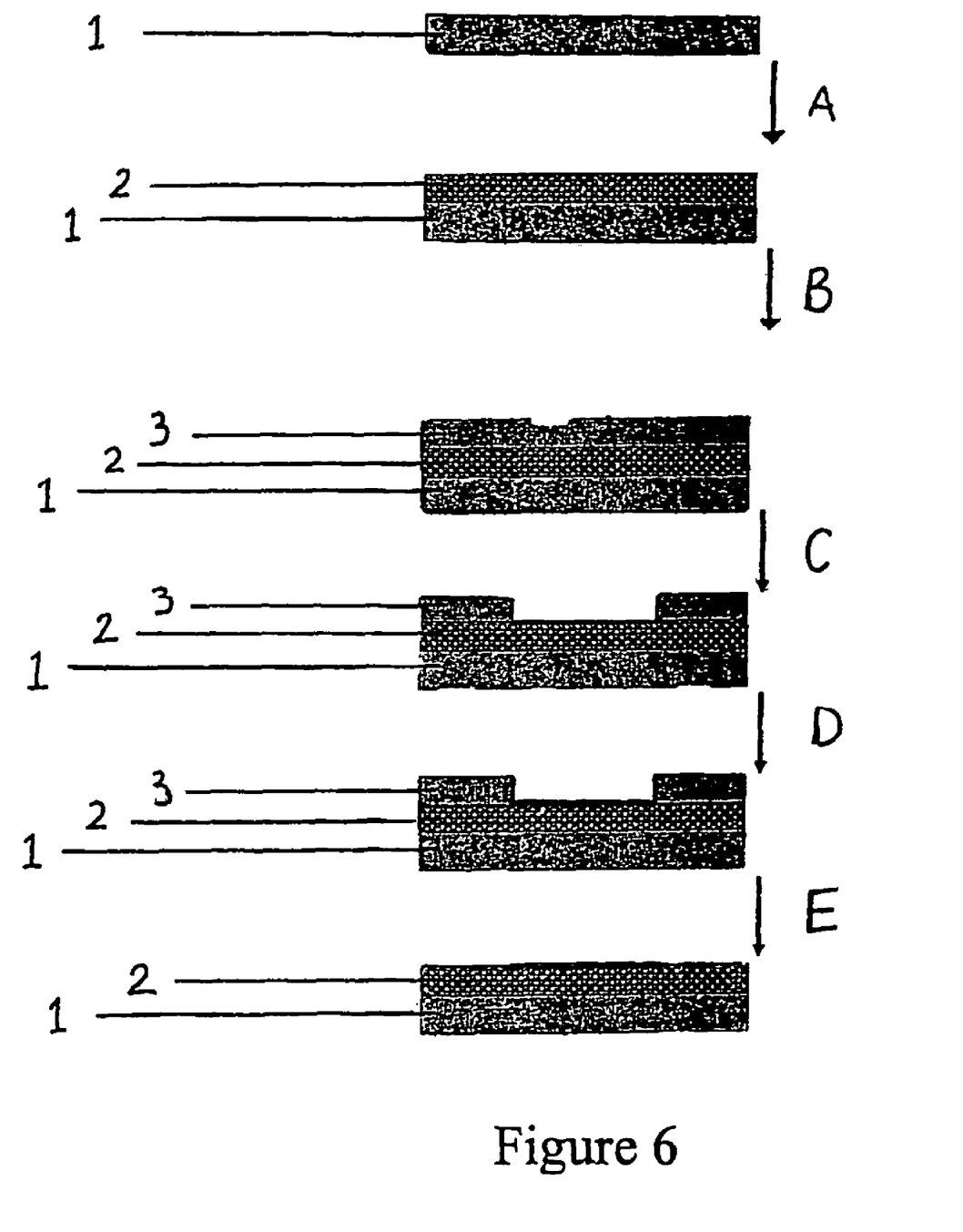
FIG. 6. schematically depicts a sixth method of realising the method of the present invention.

Producing Substrates Having Hydrophilic vs. Hydrophobic and Oleophilic Wetting Contrasts According to a sixth method depicted schematically in FIG. 6, a substrate having hydrophilic vs. hydrophobic and oleophilic wetting contrasts is prepared by coating a substrate base (1) (e.g. a polyimide (PI), polyethylene terephthalate (PET), polyethylene naphthalate (PEN), polycarbonate (PC), polynorbornene (PNB) or polyethersulfone (PES) sheet with e.g. a thickness of 100-150 μm and A4 (210×297 mm) dimensions) with a composition comprising a polymer (2) (e.g. polymethylmethacrylate (PMMA)), particles (e.g. nanoparticles of average particle size 10-20 nm) of an inorganic material (e.g. $SiO_2$) and a solvent (e.g. butylacetate) (Step A). The inorganic material may for example be present in the polymer in an amount of 50 vol. % relative to the total amount of polymer and inorganic particles. For example, a 1 μm thick layer of polymer matrix and inorganic material could be applied to the substrate base by spin-coating or doctor-blading. The coated substrate base is then left to dry, to form a substrate precursor.

Subsequently, the substrate precursor is coated with a photoresist material (3) (e.g. Shipley photoresist S1800 series) (Step B) which is then removed in a pattern as desired using e.g. UV exposure through a photomask, followed by a photoresist development with MF 319 developer) to reveal a pattern of the underlying polymer and inorganic material layer (Step C). Then, the surface is exposed to a surface oxidation treatment (e.g. by $O_2$ plasma for 7 seconds at a flow-rate of 200 ml/min and at a power of 200 W) which etches away a portion of the polymer matrix surrounding the inorganic particles, thus revealing the inorganic material at the surface and rendering the treated part of the surface hydrophilic (Step D). Next, the photoresist (3) is removed (e.g. by Microposit remover 1165) (Step E) to form the substrate.

The resulting substrate has a good wetting contrast formed between the etched and unetched areas of the surface layer of the substrate wherein the difference in hydrophilicity and/or oleophilicity between these areas is greater than that which is achievable in the prior art (when avoiding fluorinated surfaces), in part because of the surface roughening caused both in the etched and unetched areas as a result of the presence of the inorganic particles both on and immediately under the surface of the substrate. This is useful in certain applications where it is not desirable to use substrates with fluorinated surfaces.

Methods of Producing Microelectronic Components

The most important use of the substrates obtainable by the methods of the present invention and the substrates of the present invention is in the production of microelectronic components by ink-jet printing or otherwise depositing electronically functional inks onto the substrates. In particular, microelectronic components such as thin-film transistors and light-emitting diodes can be produced by appropriate sequential deposition of electronically functional ink onto the substrates, the wetting contrasts helping to direct the electronically functional inks onto appropriate areas of the substrate. In these processes, it is not necessarily the case that all of the elements which make up the microelectronic component are ink-jet printed. It may be the case that some or all of the elements are deposited by other means. However, it is most preferable to use ink-jet printing to deposit all of the elements making up the microelectronic component on the substrate. It is particularly preferable to deposit any semiconductor layers using ink-jet printing.

For example, the substrates of the present invention could be used to produce a thin-film transistor by ink-jet printing (or otherwise depositing) a conductor solution onto the substrate to form source and drain electrodes, making use of the wetting contrasts to deposit the electrodes accurately. After the conductor ink has dried to form the electrodes, a solution comprising a semiconductor is deposited (e.g. by ink-jet printing) onto the substrate with the electrodes and left to dry. An insulator material is then deposited onto the dried semiconductor material (e.g. by ink-jet printing). Once the insulator material is dry, a gate electrode is formed on the insulator material in appropriate alignment with the source and drain electrodes, thus completing the formation of the thin-film transistor.

The substrates of the present invention can also be used to produce for example a light-emitting diode. This is achieved by firstly ink-jet printing or otherwise depositing a semiconductor material onto a substrate on which an electrode has already been formed (e.g. by ink-jet printing a conductor solution onto the substrate), again making use of the wetting contrast, and leaving the deposited ink to dry to form a charge injection layer. Once the charge injection layer is dry, an emissive semiconductor material is deposited onto the charge injection layer (e.g. by ink-jet printing). Once this is dry, a cathode is formed on the emissive semiconductor material.

EXAMPLES

The following experimental work was carried out by the present inventors, and supports their findings that flexible substrates comprising wetting contrasts associated with inorganic materials at their surfaces are advantageous in that adjacent surface areas differing greatly in hydrophilicity and/or oleophilicity can be achieved. It is noted that although rigid glass plates were used in the Examples, the techniques shown are equally applicable to flexible substrate precursors in which case flexible substrates with good wetting contrasts would be produced.

Example 1

Modification of Surface Properties by Plasma Treatment

Preparation of Substrates
Reference Substrate

A 3% polymethylmethacrylate (PMMA) solution in butylacetate was prepared by dissolving 0.93 g of PMMA (from Sigma Aldrich) in 30 ml butylacetate. 0.5 ml of the solution was spin coated onto a glass substrate (12×12 mm) precursor (7059 from Corning) for 30 seconds at 1500 rpm in air. The coated precursor was then annealed for 10 minutes at 100° C. in air to form a Reference Substrate.

Substrate 1

0.028 g of nanoparticulate $SiO_2$ (hexamethyldisilazane treated silica particles, 10-20 nm, from ABCR) was dispersed in 1 ml 6% PMMA in butylacetate (Aldrich) and 1 ml butylacetate (Aldrich). The mixture was mixed thoroughly by stirring on a magnetic stirrer and by a final ultrasonic mixing step in an ultrasonic bath for 5 minutes to yield a solution comprising 17.3 vol. % $SiO_2$. 0.5 ml of the solution was spin coated onto a glass substrate precursor (12×12 mm plate, 7059 from Corning) for 30 seconds at 1600 rpm in air. The coated precursor was then annealed for 12 minutes at 100° C. in air to form Substrate 1.

Substrate 2

The procedure outlined above for substrate 1 was repeated, except that 0.056 g of $SiO_2$ was used. The solution thus obtained comprised 29.5 vol. % $SiO_2$. The solution was spin-coated onto a precursor as in Example 1, except that it was carried out at 2000 rpm.

Substrate 3

The procedure outlined above for substrate 1 was repeated, except that 0.085 g of $SiO_2$ was used and that 1.5 ml of butylacetate was used rather than 1 ml. The solution thus obtained comprised 38.6 vol. % $SiO_2$. The solution was spin-coated onto a precursor as in Example 1, except that it was carried out at 2000 rpm.

Substrate 4

The procedure outlined above for substrate 1 was repeated, except that 0.110 g of $SiO_2$ was used and that 2 ml of butylacetate was used rather than 1 ml. The solution thus obtained comprised 44.9 vol. % $SiO_2$. The solution was spin-coated onto a precursor as in Example 1, except that it was carried out at 2000 rpm.

Substrate 5

The procedure outlined above for substrate 1 was repeated, except that 0.136 g of $SiO_2$ was used and that 2 ml of butylacetate was used rather than 1 ml. The solution thus obtained comprised 50.4 vol. % $SiO_2$. The solution was spin-coated onto a precursor as in Example 1, except that it was carried out at 2000 rpm.

Plasma Treatment and Measurements

Substrates 1-5 and the Reference Substrate were rinsed with water. Then the contact angles with water droplets of size 1-5 μl were measured for each of these six substrates using a goniometer (=contact angle measuring device).

Subsequently, each of the six substrates was exposed to an $O_2$ plasma treatment (in a Branson/IPC Series S2100 Plasma Stripper system equipment) for 7 seconds at a flow rate of 200 ml/min and at a power of 200 W. Contact angles of the treated substrates were measured using the same apparatus and methods as above.

Subsequently, each of the six oxidised substrates was exposed to $CF_4$ plasma in a Branson/IPC Series S2100 Plasma Stripper system for 7 seconds at a flow rate of 200 ml/min and at a power of 200 W. Then the substrates were rinsed with de-ionised water (Elix 10 DI water plant). Contact angles of the treated substrates were measured using the same apparatus and methods as above.

Finally, the film thickness of each of the six substrates was measured using a Dektak 8 stylus profiler technique.

The resulting data is set out in table 2 below:

TABLE 2

|  | Ref. | B1 | B2 | B3 | B4 | B5 |
|---|---|---|---|---|---|---|
| Vol. % ($SiO_2$) in solid film | 0 | 17.3 | 29.5 | 38.6 | 44.9 | 50.4 |
| Spin-coating speed (rpm) | 1500 | 1600 | 2000 | 2000 | 2000 | 2000 |
| I. Initial contact angle after water-rinse | 74° | 82 | 92° | 100° | 117° | 125° |
| II. Contact angle after (5 + 2)s $O_2$-plasma; flow-rate $O_2$ 200 ml/min, power 200 W | 7° | 15° | 5° | 5° | 5° | 5° |
| III. Contact angle after (5 + 2)s $CF_4$-plasma; flow-rate $CF_4$ 200 ml/min, power 200 W; measured after water-rinse | 76° | 90° | 53° | 10° | 5° | 5° |
| Final film thickness (nm) | 436 | 530 | 150 | 500 | 350 | 680 |

Example 2

Modification of Surface Properties by Silanisation with a Fluoroalkylsilane

Preparation of Substrates

A Reference Substrate and Substrates 1-5 were Prepared as in Example 1 above.

Plasma Treatment and Measurements

Substrates 1-5 and the Reference Substrate were rinsed with water. Then the contact angles with water were measured for each of these six substrates using a goniometer (contact angle measuring device) with droplet size 1-5 μl.

Subsequently, each of the six substrates was exposed to a $CF_4$ plasma treatment in a Branson/IPC Series S2100 Plasma Stripper system for 7 seconds at a flow rate of 200 ml/min and at a power of 200 W. Contact angles of the treated substrates were measured using the same apparatus and methods as above. In the substrates with high oxide content (B4 and B5), the inventors observed a fast initial decrease of the contact angles, with the values slowly stabilising after prolonged measurement times. Thus, the contact angle ranges reported in table 3 below for the high oxide content samples correspond to the initial values and the values obtained after 5 minutes measuring time.

Subsequently, each of the six fluorinated substrates were exposed to another $CF_4$ plasma treatment in a Branson/IPC Series S2100 Plasma Stripper system for 7 seconds at a flow rate of 200 ml/min and at a power of 200 W. Contact angles of the treated substrates were measure using the same apparatus and methods as above. Again, an initial decrease of the contact angles was observed for the samples B4 and B5, with the values slowly stabilising after prolonged measurement times. However, due to the higher initial reaction rate after the second $CF_4$ plasma treatment, the initial contact angle values could not be determined accurately. Therefore, only the contact angles determined after 5 minutes measuring time are reported in table 3 below.

Subsequently, each of the six substrates was rinsed with de-ionised water (Elix 10 DI water plant) and the contact angles with water were measured again.

Finally, the rinsed substrates were treated with (heptadecafluorodecyl)-trichlorosilane ($CF_3(CF_2)_7CH_2CH_2SiCl_3$) in an octane solvent. The substrates were blown dry with nitrogen gas and then their contact angles with water were measured again.

The resulting data is set out in table 3 below:

TABLE 3

| | Ref. | B1 | B2 | B3 | B4 | B5 |
|---|---|---|---|---|---|---|
| Vol. % ($SiO_2$) in film | 0 | 17.3 | 29.5 | 38.6 | 44.9 | 50.4 |
| Contact angle initial | 75° | 91° | 93° | 118° | 133° | 133° |
| (5 + 2)s 200 ml/min $CF_4$/ 200 W | 105° | 110° | 116° | 95° | 85° to 50° | 85° to 55° |
| (5 + 2)s 200 ml/min $CF_4$/ 200 W | 101° | 110° | 118° | 89° | 45° | 40° |
| Rinsing with water | 100° | 92° | 90° | 57° | 27° | 30° |
| Fluoro-SAM in octane | | 110° | 127° | 145° | 140° | 145° |

Data Analysis

From the above data, it can be seen that it is possible to create highly hydrophilic and highly hydrophobic surfaces from substrates which have silicon dioxide at their surface. Where a flexible substrate precursor is used, these substrates would be flexible and therefore useful in e.g. ink-jet printing processes as a part of reel-to-reel processing. Thus it is possible to manufacture flexible substrates comprising good wetting contrasts by carrying out the methods 1-6 described above, as well as by other methods known to the person skilled in the art, all of which make use of substrates comprising an inorganic material at the surface. It is noted that although these substrates have applicability in the production of microelectronic devices by ink-jet printing, other uses of the substrates can readily be envisaged where it is desired to have a flexible substrate with a wetting contrast.

Best Mode

The best mode of the present invention is to prepare the substrate using the fourth method of the present invention as described above. This method allows the production of a flexible substrate without the need for plasma treatment at any stage, which is attractive because plasma treatment can only be carried out in a vacuum chamber, which is not easily or cheaply installed. Furthermore, the fourth method does not require a washing step, and allows the production of a substrate comprising a wetting contrast with only a few simple steps. The fourth method requires only the steps of coating the substrate precursor with a solution of a polymer and an inorganic material polymer, drying the coated precursor to form the substrate, micro-embossing the substrate and then exposing the un-embossed areas to a fluoroalkylsilane. All of these steps are easily carried out in the context of reel-to-reel processing. Preferably, the fourth method is carried out in the following manner:

According to the fourth method, depicted schematically in FIG. 4, a flexible substrate is prepared by coating a flexible, pre-treated clear polyester substrate precursor (heat-stabilised, 125 μm thickness, 45×45 mm, from Coveme, Italy) with a PMMA solution in butylacetate, the solution comprising 50 vol. % $SiO_2$ particles (hexamethyldisilazane treated silica particles, 10-20 nm, from ABCR) relative to the total amount of polymer and inorganic particles, by spin-coating 1 ml of the solution onto the substrate precursor for 30 seconds at 2000 rpm in air. The coated precursor is then annealed for 12 minutes at 100° C. in air to form the substrate.

The substrate is then micro-embossed with a silicon mould for 20 minutes at 140° C., 20 bar pressure, to form a patterned area where the polymer layer is compressed. The surface is then oxidised by atmospheric corona treatment to render the entire surface hydrophilic. Heptadecafluorodecyl trichlorosilane is then applied to the substrate surface (the non-embossed areas) with a non-patterned polydimethylsiloxane (PDMS) soft stamp (Step D). This renders the substrate surface hydrophobic and oleophobic, while the embossed areas remain hydrophilic.

The invention claimed is:

1. The method of producing a microelectronic component, comprising:
   (i) producing a flexible substrate or modified substrate having adjacent areas of different hydrophilicity and/or oleophilicity on the same surface by a method comprising:
      (a) forming a layer comprising an inorganic material on a flexible substrate precursor so that substantially no inorganic material is present at the surface, and
      (b) patternwise treating the precursor comprising the layer to reveal inorganic material at the surface where the precursor has been treated; and
   (ii) depositing a first solution onto the substrate or modified substrate to form an area comprising a first electronically functional material,
   wherein the microelectronic component is at least one of a light emitting diode and a thin-film transistor.

2. The method according to claim 1, wherein the microelectronic component is a thin-film transistor and the first electronically functional material is a semiconductor material, and the method further comprises:
   (iii) prior to depositing the first solution, depositing a second solution onto the substrate or modified substrate to form source and drain electrodes so that these underlie the area comprising the first electronically functional material;
   (iv) depositing a third solution onto the semiconductor material to form an insulating layer; and
   (v) forming a gate electrode on the insulator material in appropriate alignment with the source and drain electrodes.

3. The method according to claim 1, wherein the microelectronic component is a light emitting diode, and the first electronically functional material is a semiconductor material which constitutes a charge injection layer, and the substrate or modified substrate comprises an anode, the method further comprising:

(iii) depositing a fourth solution onto the first semiconductor material to form an area comprising a second emissive semiconductor material; and (iv) forming a cathode on the second semiconductor material.

4. The method according to claim 1, wherein the deposition of the solutions is carried out by ink-jet printing.

5. The method according to claim 1, which is carried out using reel-to-reel processing.

6. A method of making a microelectronic component including a flexible substrate having adjacent areas of different hydrophilicity and/or oleophilicity, the method comprising:

(i) producing a substrate by a method comprising:

coating a flexible substrate precursor with a polymer layer including a polymer matrix and inorganic particles;

micro-embossing the polymer layer to form a pattern at a temperature above a glass transition temperature of the polymer matrix, the polymer layer having a patterned area and a non-patterned area;

oxidizing an entire surface of the polymer layer to render the entire surface hydrophilic; and providing a fluoroalkylsilane to the non-patterned area to render a surface of the non-patterned area hydrophobic and oleophobic; and (ii) depositing a first solution onto the substrate to form an area comprising a first electronically functional material, wherein the microelectronic component is at least one of a light emitting and a thin-film transistor.

7. The method according to claim 6, wherein the microelectronic component is a thin-film transistor and the first electronically functional material is a semiconductor material, and the method further comprises:

(iii) prior to depositing the first solution, depositing a second solution onto the substrate or modified substrate to form source and drain electrodes so that these underlie the area comprising the first electronically functional material;

(iv) depositing a third solution onto the semiconductor material to form an insulating layer; and (v) forming a gate electrode on the insulator material in appropriate alignment with the source and drain electrodes.

8. The method according to claim 6, wherein the microelectronic component is a light emitting diode, and the first electronically functional material is a semiconductor material which constitutes a charge injection layer, and the substrate or modified substrate comprises an anode, the method further comprising:

(iii) depositing a fourth solution onto the first semiconductor material to form an area comprising a second emissive semiconductor material; and (iv) forming a cathode on the second semiconductor material.

9. The method according to claim 6, wherein the deposition of the solution is carried our by ink-jet printing.

10. The method according to claim 6, which is carried out using reel-to-reel processing.

11. A method according to claim 6, wherein the flexible substrate precursor is selected from the group consisting of metal foils and polymer foils.

12. A method according to claim 11, wherein the polymer foil is selected from the group consisting of polyimide foils, polyethylene terephthalate foils, polyethylene naphthalate foils, polycarbonate foils, polynorbornene foils and polyethersulfone foils.

13. A method according to claim 6, wherein the inorganic particles are inorganic oxide particles.

14. A method according to claim 13, wherein the inorganic oxide is selected from the group consisting of silicon dioxide, aluminum oxide, titanium dioxide, tin oxide, tantalum pentoxide, indium tin oxide, perovskites and quaternary oxides.

15. A method according to claim 6, wherein the inorganic particles have an average particles size of less than 5 μm.

16. A method according to claim 6, wherein oxidation is achieved by a chemical treatment selected from the group consisting of $O_2$ plasma treatment, ozone/UV treatment and corona discharge treatment in air.

17. A method according to claim 6, wherein the fluoroalkylsilane is (heptadecafluorodecyl)-trichlorosilane.

* * * * *